United States Patent
Aisu

(10) Patent No.: US 8,378,747 B2
(45) Date of Patent: Feb. 19, 2013

(54) DIFFERENTIAL AMPLIFIER CIRCUIT, OPERATIONAL AMPLIFIER INCLUDING DIFFERENCE AMPLIFIER CIRCUIT, AND VOLTAGE REGULATOR CIRCUIT

(75) Inventor: Katsuhiko Aisu, Takarazuka (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/010,124

(22) Filed: Jan. 20, 2011

(65) Prior Publication Data

US 2011/0181358 A1 Jul. 28, 2011

(30) Foreign Application Priority Data

Jan. 27, 2010 (JP) .................................. 2010-015674

(51) Int. Cl.
*H03F 3/45* (2006.01)
(52) U.S. Cl. ....................... 330/257; 330/261
(58) Field of Classification Search .................. 330/257, 330/261, 253
See application file for complete search history.

(56) References Cited

U.S. PATENT DOCUMENTS

| | | | | |
|---|---|---|---|---|
| 5,113,148 A | * | 5/1992 | Theus | 330/253 |
| 5,304,943 A | * | 4/1994 | Koontz | 330/51 |
| 6,246,221 B1 | | 6/2001 | Xi | |
| 6,762,646 B1 | * | 7/2004 | Bell | 330/257 |
| 7,057,460 B2 | * | 6/2006 | Kaviani et al. | 330/261 |
| 7,253,595 B2 | | 8/2007 | Oddoart et al. | |
| 7,852,157 B2 | * | 12/2010 | Yuasa | 330/258 |
| 7,859,339 B2 | * | 12/2010 | Ide | 330/257 |
| 2007/0152752 A1 | * | 7/2007 | Oishi | 330/252 |

FOREIGN PATENT DOCUMENTS

| | | |
|---|---|---|
| JP | 2002-157031 | 5/2002 |
| JP | 2007-249712 | 9/2007 |
| JP | 4236586 | 12/2008 |
| JP | 2009-53783 | 3/2009 |
| JP | 2011-22689 | 2/2011 |

* cited by examiner

*Primary Examiner* — Henry Choe
(74) *Attorney, Agent, or Firm* — Cooper & Dunham LLP

(57) ABSTRACT

A differential amplifier circuit includes a differential input stage comprising first and second transistors whose sources are connected with each other, a constant current source connected between the sources of the first and second transistors and a ground, a current mirror circuit comprising third and fourth transistors whose sources are connected with a power supply source, a fifth transistor of a same conductive type as that of the first transistor, connected at a drain to a drain of the third transistor, connected at a source to a drain of the first transistor and connected at a gate to a reference voltage source; and a sixth transistor of a same conductive type as that of the second transistor, connected at a drain to a drain of the fourth transistor, connected at a source to a drain of the second transistor, and connected at a gate to the reference voltage source.

2 Claims, 2 Drawing Sheets

DIFFERENTIAL AMPLIFIER CIRCUIT, OPERATIONAL AMPLIFIER INCLUDING DIFFERENCE AMPLIFIER CIRCUIT, AND VOLTAGE REGULATOR CIRCUIT

CROSS REFERENCE TO RELATED APPLICATION

The present application is based on and claims priority from Japanese Patent Application No. 2010-015674, filed on Jan. 27, 2010, the disclosure of which is hereby incorporated by reference in its entirety.

BACKGROUND OF THE INVENTION

1. Field of the Invention

The present invention relates to a differential amplifier circuit, an operational amplifier including the differential amplifier circuit, and a voltage regulator circuit.

2. Description of the Related Art

A differential amplifier circuit and a low-dropout regulator comprising such a differential amplifier are disclosed in, for example, Japanese Patent Application Publication No. 2009-053783, No. 2007-249712, No. 2002-157031, and Japanese Patent No. 4236586.

FIG. 4 shows an example of a prior art differential amplifier circuit. In general, a differential amplifier circuit is configured to heighten input impedance as much as possible or increase an output impedance of an input signal source as much as possible. However, an extremely high output impedance of the input signal source may affect input signals. For example, a fluctuation in a voltage of a power supply source VDD is transmitted in an almost same magnitude to a node A connecting transistors M3, M4 constituting a constant current source and transistors M1, M2 constituting a differential input stage, and inputted thereto as input signals VIN1, VIN2 via a gate to drain capacitance of the transistors M1, M2. With provision of a bypass condenser bypassing the node A of the transistors M1, M2, only a voltage difference input via the gate to drain capacitance is transmitted to the node A, reducing an influence from the voltage fluctuation in the power supply source Vdd effectively. However, there is a drawback that a size of an LSI is increased by addition of the bypass condenser.

SUMMARY OF THE INVENTION

The present invention aims to provide a differential amplifier circuit which exerts a good removal characteristic of a fluctuation in a power supply voltage without a large bypass condenser even when connected with a signal source having a high output impedance.

According to one aspect of the present invention, a differential amplifier circuit comprises a differential input stage comprising first and second transistors whose sources are connected with each other; a constant current source connected between the sources of the first and second transistors and a ground; a current mirror circuit comprising third and fourth transistors whose sources are connected with a power supply source; a fifth transistor of a same conductive type as that of the first transistor, connected at a source to a drain of the third transistor and connected at a gate to a reference voltage source; and a sixth transistor of a same conductive type as that of the second transistor, connected at a drain to a drain of the fourth transistor, connected at a source to a drain of the second transistor, and connected at a gate to the reference voltage source.

BRIEF DESCRIPTION OF THE DRAWINGS

Features, embodiments, and advantages of the present invention will become apparent from the following detailed description with reference to the accompanying drawings.

DETAILED DESCRIPTION OF THE PREFERRED EMBODIMENTS

Hereinafter, embodiments of the present invention will be described in detail with reference to the accompanying drawings.

First Embodiment

Figure 1:
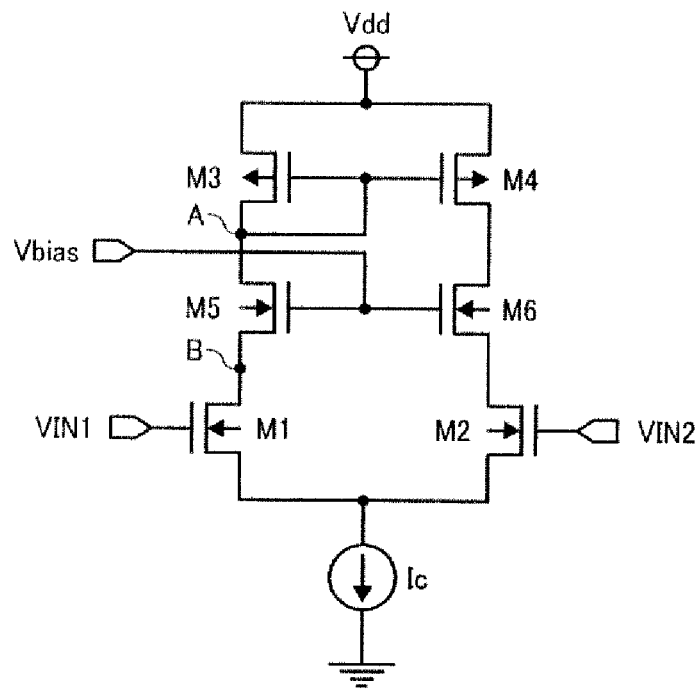
FIG. 1 shows a configuration of a differential amplifier circuit according to a first embodiment of the present invention.

FIG. 1 shows a configuration of a differential amplifier circuit according to a first embodiment of the present invention. The differential amplifier circuit comprises a differential input stage comprising N-type field-effect transistors (hereinafter, N-type transistor) M1, M2, a current mirror circuit comprising P-type field-effect transistors (hereinafter, P-type transistor) M3 and M4, N-type transistors M5, M6 connected between the differential input stage and the current mirror circuit to function as a fluctuation inhibitor, and a constant current source Ic connected between the differential input stage and a ground.

The N-type transistors M1, M2 are input transistors of the differential input stage. The N-type transistor M1 is connected at its source to the constant current source Ic and an input signal VIN1 is input to its gate. The N-type transistor M2 is connected at its source to the constant current source Ic and an input signal VIN2 is input to its gate.

The sources of the P-type transistors M3, M4 are connected to the power supply source Vdd and the gates thereof are connected to each other. A connecting node of the gates is connected to the drain of the P-type transistor M3, constituting the current mirror circuit.

The source of the N-type transistor M5 is connected to the drain of the N-type transistor M1 and the drain thereof is connected to the drain of the N-type transistor M3. Likewise, the source of the N-type transistor M6 is connected to the drain of the N-type transistor M2 and the drain thereof is connected to the drain of the N-type transistor M4. The gates of the N-type transistors M5, M6 are connected with each other and a connecting node thereof is connected to a reference voltage line Vbias.

Figure 4:
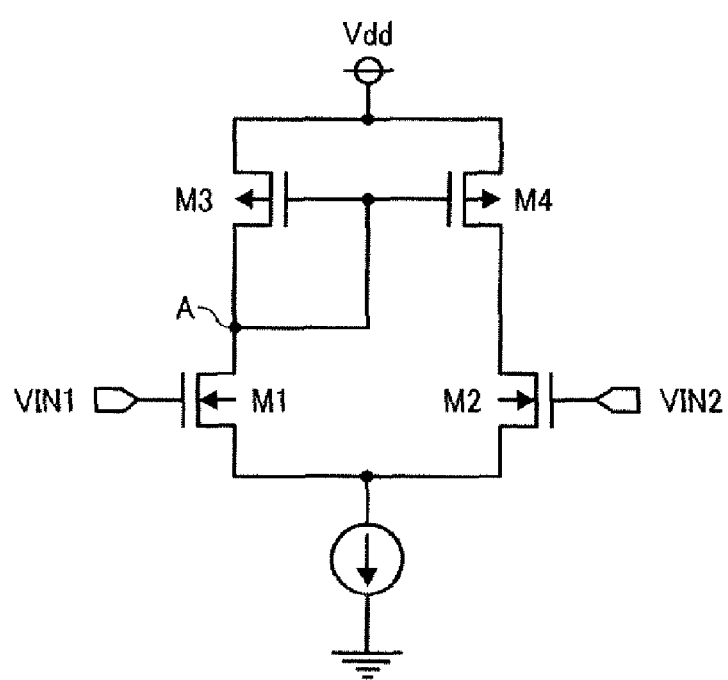
FIG. 4 shows a configuration of a prior art differential amplifier circuit.

A difference between the differential amplifier circuit according to the present embodiment and the prior art one in FIG. 4 is in addition of the transistors M5, M6. The transistors M5, M6 can reduce a voltage fluctuation of a node B due to a voltage fluctuation of the power supply source Vdd although a fluctuation in the same magnitude as that of the power supply source Vdd does occur at a node A. A current of a MOS transistor is expressed by the following equation:

$$Id = \mu \cdot Cox \cdot W/L/2 \cdot (Vgs-Vth)2 \cdot (1+\lambda Vds)$$

where Id is a drain current, $\mu \cdot Cox \cdot W/L$ is a gain coefficient, Vgs is a gate to source voltage, Vth is a threshold voltage, $\lambda$ is a channel length modulation factor and Vds is a drain to source voltage. Thus, the drain current Id varies by a square of a variance of the gate to source voltage Vgs. In other words, a variance of Vgs is extremely small when a constant current is flowed. Further, at the channel modulation factor λ being small, a variance in the drain current Id is small relative to a variance of Vgs. It is found out from the above that with a fluctuation in the power supply voltage Vdd, a voltage of the node A fluctuates almost the same as the power supply voltage, however, a fluctuation in the voltage of the node B is reduced.

The reference voltage Vbias supplied to the gates of the transistors M5, M6 need be generated by a constant voltage source which does not fluctuate along with a fluctuation in the power supply voltage Vdd. A voltage source having a relatively low output impedance and outputting a voltage without a low pass filter is preferable for a low noise LDO (low dropout voltage regulator). However, it should not be limited thereto and generation of such a voltage can be realized in various manners.

The differential amplifier circuit in the present embodiment comprises a differential input stage comprising first and second transistors M1, M2 whose sources are connected with each other, a constant current source Ic connected between the sources of the first and second transistors M1, M2 and a ground; a current mirror circuit comprising third and fourth transistors M3, M4 whose sources are connected to a power supply source; a transistor M5 of a same conductive type as that of the first transistor M1 whose drain is connected to the drain of the third transistor M3, source is connected to the drain of the first transistor M1, and gate is connected to the reference voltage source Vbias; and a sixth transistor M6 of a same conductive type as that of the second transistor M2 whose drain is connected to the drain of the fourth transistor M4, source is connected to the drain of the second transistor M2 and gate is connected to the reference voltage source Vbias.

With such a configuration, it is possible to realize a differential amplifier circuit which can exert a good removal characteristic of a fluctuation in a power supply voltage without a large bypass condenser even when connected with a signal source having a high output impedance.

Second Embodiment

Figure 2:
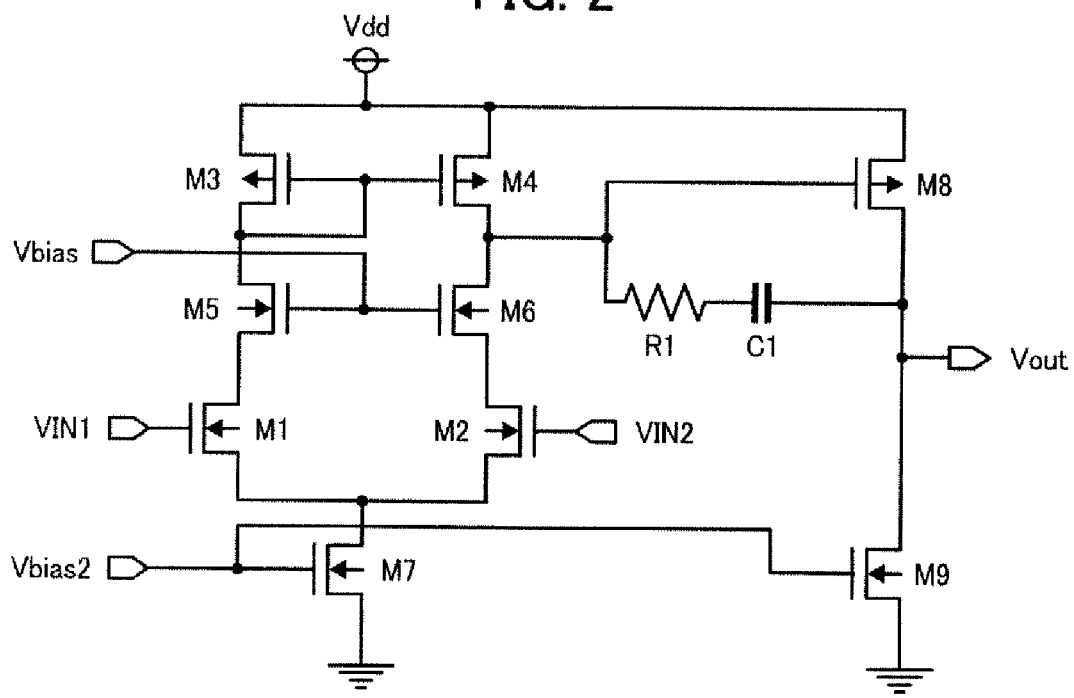
FIG. 2 shows a circuit configuration of an operational amplifier according to a second embodiment of the present invention.

An operational amplifier according to a second embodiment will be described with reference to FIG. 2. The operational amplifier in the drawing comprises almost the same differential amplifier circuit as that in the first embodiment. A difference from the one in the first embodiment is in that the constant current source comprises an N-type MOS transistor M7. The transistor M7 is grounded at a source, connected to a connection node of the sources of the transistors M1, M2 at a drain, and connected to a second reference voltage source Vbias2 at a gate.

The operational amplifier further comprises a P-type transistor M8 and an N-type transistor M9 between the power supply source Vdd and the ground.

The P-type transistor M8 is connected to the power supply source Vdd at a source, connected to the drain of the N-type transistor M9 at a drain, and connected at a gate to a connection node of the drains of the N-type transistor M6 of the differential amplifier circuit and the P-type transistor M4. A resistance R1 and a condenser C1 are connected in series between this connection node and the drain of the P-type transistor M8 to bypass between the gate and drain of the P-type transistor M8.

The N-type transistor M9 is grounded at a source and connected to the second reference voltage source Vbias2 at a gate, constituting a constant current source.

An voltage Vout is output from a connection node of the drains of the P-type transistor M8 and the N-type transistor M9.

The operational amplifier in such a configuration outputs the drain voltage of the P-type transistor M8 as the voltage Vout by the differential amplifier circuit's operation to control the P-type transistor M8 by the drain voltage of the P-type transistor M4.

This differential amplifier circuit included in the operational amplifier can attain the same advantageous effects as in the first embodiment.

Third Embodiment

Figure 3:
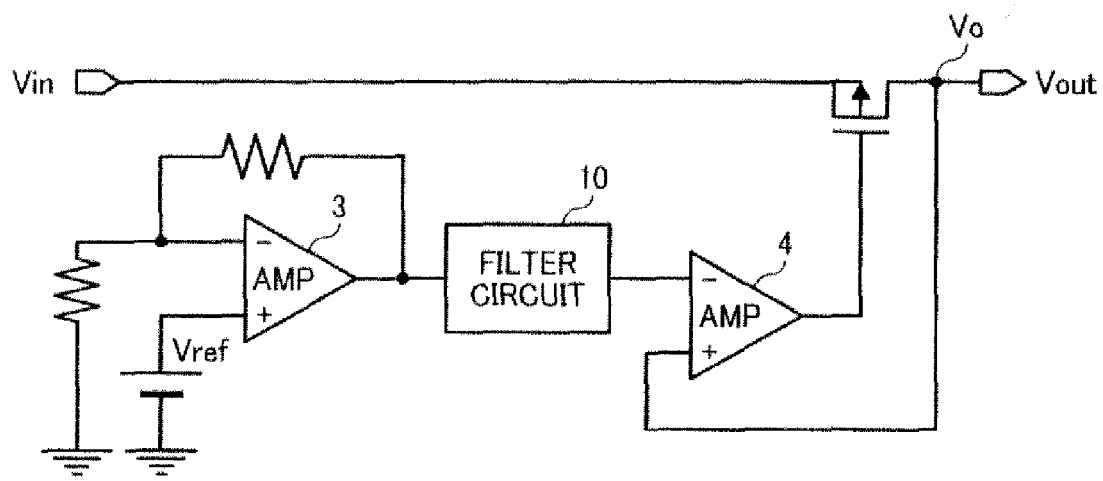
FIG. 3 shows a circuit configuration of a voltage regulator according to a third embodiment of the present invention.

A voltage regulator according to a third embodiment will be described with reference to FIG. 3. The voltage regulator is configured to output a voltage with low noise. That is, it comprises amplifiers (AMP) 3, 4 and a filter circuit 10 which reduces a noise due to a device (AMP3) superimposed on an output of the AMP 3. The filter circuit 10 intends to reduce noise such as 1/f noise, and preferably, it is comprised of a low pass filter with as low cutoff frequency as possible. A problem of very high output impedance of the filter circuit 10 may arise when the filter circuit 10 with a low cutoff frequency is configured of a simple circuit. Specifically, impedance of the input signal source of the AMP4 is increased. By using the differential amplifier circuit according to the first embodiment for the AMP4 or the operational amplifier according to the second embodiment for an error amplifier, it is made possible to prevent a voltage fluctuation of the power supply source from being superimposed on input signals.

Although the present invention has been described in terms of exemplary embodiments, it is not limited thereto. It should be appreciated that variations or modifications may be made in the embodiments described by persons skilled in the art without departing from the scope of the present invention as defined by the following claims.

What is claimed is:

1. A voltage regulator circuit comprising an operational amplifier as an error amplifier, the operational amplifier comprising a differential amplifier circuit which comprises:
   a differential input stage comprising first and second transistors whose sources are connected with each other, and to which an output voltage of the voltage regulator circuit is input;
   a constant current source connected between the sources of the first and second transistors and a ground;
   a current mirror circuit comprising third and fourth transistors whose sources are connected with a power supply source;
   a fifth transistor of a same conductive type as that of the first transistor, connected at a drain to a drain of the third transistor, connected at a source to a drain of the first transistor and connected at a gate to a reference voltage source;
   a sixth transistor of a same conductive type as that of the second transistor, connected at a drain to a drain of the fourth transistor, connected at a source to a drain of the second transistor, and connected at a gate to the reference voltage source;
   an N-type transistor grounded at a source of the N-type transistor;
   a P-type transistor connected at a source of the P-type transistor to the power supply source, connected at a drain of the P-type transistor to a drain of the N-type transistor, and connected at a gate of the P-type transistor to a connection node between the drain of the fourth transistor and the drain of the sixth transistor; and a resistance and a bypass condenser connected in series between the drain of the sixth transistor and the drain of the P-type transistor, wherein the constant current source comprises an N-type MOS transistor and the N-type transistor which are connected at respective gates thereof to a second reference voltage source.

2. A voltage regulator circuit according to claim 1, further comprising a low pass filter connected to an input of the differential input stage, to apply an output voltage to the differential input stage.

* * * * *